United States Patent [19]

Mollet et al.

[11] Patent Number: 4,785,136
[45] Date of Patent: Nov. 15, 1988

[54] ELECTROMAGNETIC INTERFERENCE SHIELDING COVER

[76] Inventors: John R. Mollet, 269 River Dr., River Vale, N.J. 07675; Richard M. Gaiser, 5371 Tonawanda Creek Rd., Pendleton, N.Y. 14120

[21] Appl. No.: 929,407

[22] Filed: Nov. 10, 1986

[51] Int. Cl.⁴ ............................................. H05K 1/00
[52] U.S. Cl. ............................. 174/35 R; 174/35 MS
[58] Field of Search ....................... 174/35 R, 35 MS; 361/424

[56] References Cited

U.S. PATENT DOCUMENTS

| | | | |
|---|---|---|---|
| 2,488,710 | 11/1949 | Cooper | 174/35 MS |
| 3,341,102 | 9/1967 | Stephens et al. | 174/35 MS |
| 3,469,015 | 9/1969 | Warren | 174/35 GC |
| 3,546,359 | 12/1970 | Ciccarelli et al. | 174/35 MS |
| 3,604,166 | 8/1971 | Ciccarelli et al. | 174/35 MS |
| 4,215,796 | 8/1980 | Johnston et al. | 174/35 R |
| 4,308,417 | 12/1981 | Martin | 174/35 GC |
| 4,331,285 | 5/1982 | Gottwalls | 174/35 R |
| 4,468,702 | 8/1984 | Jandrell | 174/35 R |
| 4,539,433 | 9/1985 | Ishino et al. | 174/35 MS |
| 4,647,714 | 3/1987 | Goto | 174/35 R |

FOREIGN PATENT DOCUMENTS

| | | | |
|---|---|---|---|
| 0153823 | 9/1985 | European Pat. Off. | 174/35 R |
| 2027238 | 9/1971 | Fed. Rep. of Germany | 174/35 R |
| 2419651 | 10/1979 | France | 174/35 R |
| 0069301 | 6/1979 | Japan | 174/35 MS |
| 0177699 | 9/1985 | Japan | 174/35 R |
| 1549593 | 8/1979 | United Kingdom | 174/35 MS |

Primary Examiner—R. L. Moses
Assistant Examiner—David A. Tone
Attorney, Agent, or Firm—McGlew & Tuttle

[57] ABSTRACT

An electromagnetic interference shielding cover for computer terminals or the like comprising a layer of woven metallic or metallized synthetic conductive fabric covering the computer terminal top side, bottom side, right side, left side, front side and rear side. The embodiments described provide full electrical and magnetic continuity throughout the shielding cover and can take the form of a free standing box-like rigid cover, or a fitted flexible cover. Woven metal or metalized conductive mesh conditioned for viewing enchancement and glare reduction is provided in an individual, framed section and connected over appropriate cut-out openings to allow continuity of electromagnetic shielding and visual access.

The shielding cover may consist of a single enclosure or where appropriate, multiple enclosures connected by means of an electro-magnetically continuous joint allowing console articulation.

15 Claims, 7 Drawing Sheets

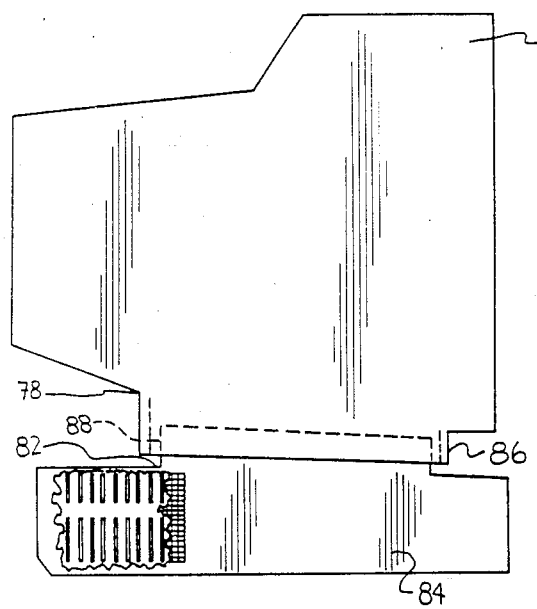
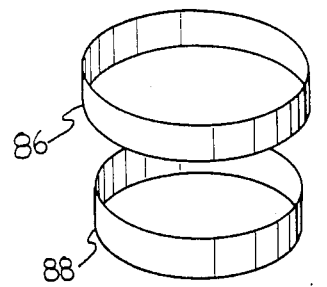
Fig. 11
Fig. 12
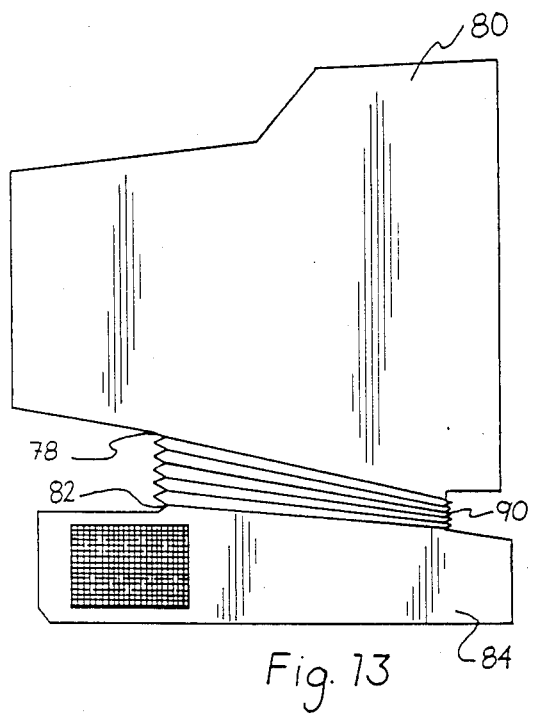
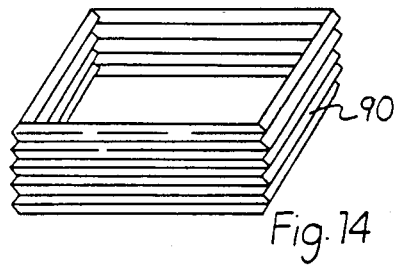
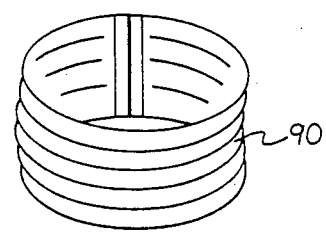
Fig. 13
Fig. 14
Fig. 15

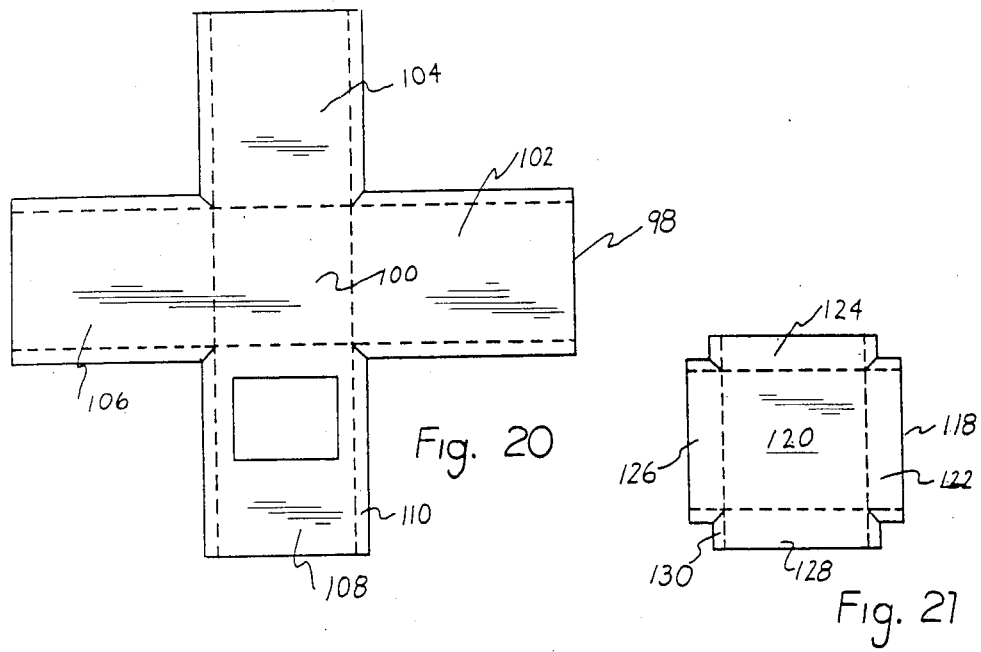
Fig. 20
Fig. 21
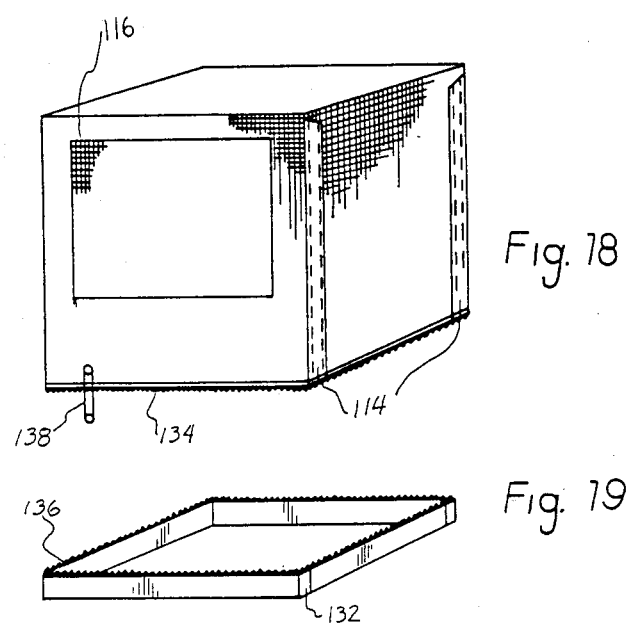
Fig. 18
Fig. 19

ELECTROMAGNETIC INTERFERENCE SHIELDING COVER

FIELD AND BACKGROUND OF THE INVENTION

The present invention relates, in general, to shielding digital electronic components and systems containing such components and in particular to a new and useful electromagnetic computer shielding. Electromagnetic shields are needed to attenuate electromagnetic fields, generated inside either the electronic device or system, so these fields do not create interference with other electronic systems or to prevent the clandestine reception of these fields or signals and prevent their unauthorized interpretation. Additionally, such shields are needed to reduce the strength of electrostatic or electromagnetic fields, entering a digital electronic system through its housing. Interference entering the housing of a digital electronic system may damage electronic components to the point of rendering them inoperative.

Prior art shielding for electronic devices has been, generally, effective in shielding such devices. Unfortunately prior art devices are cumbersome with regard to ease of use of the device shielded. Further, such prior art shields tend to be expensive both when installed by the manufacturer of the electronic device and when purchased and installed by the end user of such device.

U.S. Pat. No. 3,436,467 issued Apr. 1, 1969, to R. S. Smith, Jr. teaches an irregularly shaped shielding structure covering an irregularly shaped component which is otherwise adversely affected by electromagnetic and electrostatic fields. Although the Smith device encapsulates the electronic device in an economical, space saving manner, the Smith device takes little account of the need of access, by users of modern digital devices, to the interior of the shield (e.g. for disc egress and ingress) and the need for cable connections to the digital device without losing continuity of electric and magnetic path of the shield.

U.S. Pat. No. 4,331,285 issued May 25, 1982, to Gottwals, teaches a method of fabricating a magnetic shielding enclosure. The method relates to folding magnetically permeable material to provide essentially a gapless two-layered shield with small corner and edge radii. Although the Gottwals device provides a less expensive product, it still possesses all of the above access problems associated with the Smith.

U.S. Pat. No. 4,468,702 issued Aug. 28, 1984, to Jandrell, teaches a device for suppression of the radiation emitted by CRT circuitry. Although the Jandrell device is very effective for its designed purpose its teachings add little to the body of art dealing with the overall or complete shielding of electronic devices.

SUMMARY OF THE INVENTION

The invention is directed to the complete shielding of electronic devices, in particular digital electronic devices especially mini computers and personal computers.

In accordance with the invention an electromagnetic interference shielding cover for computers and computer terminals or the like is provided. The invention protects computer terminals of standard shape and size including at least a display unit having a front side with a display screen, a top side, a bottom side, a right side, a left side and a rear side, heat dissipation areas for allowing heat transfer from within the display unit and at least one cable running from within the display unit through one of the sides of the display unit and a computer unit having a top side, a bottom side, a right side, a left side, a rear side, a front side, heat dissipation areas for allowing heat transfer from within the computer unit, at least one cable port associated with the computer unit and internal access areas for access within the computer unit and/or disc slot access. The computer terminal or computer system may also include a stand, which may swivel, for supporting the display unit relative to the computer unit. The stand may be made integral with the display unit, the computer unit or both the display unit and the computer unit so the entire system is one integral unit.

The shielding advantageously includes fine woven wire cloth or conductive fabric of metallized synthetic monofilament or multifilament fibers (hereinafter referred to as conductive fabric) fitted in individual sections over the display unit top side, bottom side, right side, left side and rear side, respectively. Sewn areas connect each of the individual fabric sections over the display unit top side, bottom side, right side, left side and rear side, said sewn areas being fabricated such that continuity of electric and magnetic path is guaranteed. Blackened fine woven wire cloth or conductive fabric mesh of blackened and metallized monofilament conductive fibers is fitted in an individual section covering the display screen and connected to the fabric sections covering the display unit top side, bottom side, right side, left side and rear side such that continuity of electric and magnetic path is guaranteed. A cosmetic layer of wrinkle resistant fabric may be fixed to the exterior of the conductive fabric and covering the top side, bottom side, right side, left side, rear side and front side of the display unit except in the areas coincident with the display screen and heat dissipation areas of the display unit.

The computer unit is covered by conductive fabric fitted in individual sections over the computer unit top side, bottom side, right side, left side, front side and rear side, respectively. Sewn areas connect each of the individual fabric sections over the computer unit top side, bottom side, right side, left side, rear side and one edge of the individual fabric section covering the computer unit front side. The sewn areas are fabricated such that continuity of electric and magnetic path is guaranteed. Conductive fabric overlap portions are provided integrally formed with the conductive fabric section covering the computer unit front side. Each of the overlap portions extend from the area covering the computer front side in the direction of the computer top side, right side and left side respectively.

Means associated with each of said overlap sections are provided to secure each of the overlap sections to the conductive fabric covering the computer top side, right side and left side respectively. This securing means is advantageously in the form of Velcro sections, conductive snaps or a conductive zipper. A cosmetic layer of wrinkle resistant fabric is fixed to the exterior of the conductive fabric covering the top side, bottom side, right side, left side, rear side and front side of the computer unit except in the areas coincident with the heat dissipation areas of the display unit.

The electromagnetic interference shielding cover for computer terminals or the like according to the invention may also be in the form of two or more cut conductive fabrics folded so as to form the top and bottom of a box-like shape. That is, the invention contemplates either the use of fabric segments sewn into a shield or two or more fabric pieces folded and sewn into a top and bottom or a middle portion, top and bottom shielding portions.

Accordingly, it is an object of the invention to provide an improved shield for electronic equipment. Especially when such devices, which may or may not contain a shielding media, have been found to be inadequately shielded against interference, emissions of electromagnetic waves, or susceptibility and, therefore, does not meet the shielding requirements of the end-user.

Another object of the invention is to provide a conductive fabric shield for computers or the like which allows a user to have full access to all features of the computer while maintaining continuity of electric and magnetic path in the conductive fabric.

A further object of the invention is to provide a conductive fabric shield for computers or the like which is aesthetically pleasing, simple in design, rugged in construction and economical to manufacture.

The various features of novelty which characterize the invention are pointed out with particularity in the claims annexed to and forming a part of this disclosure. For a better understanding of the invention, its operating advantages and specific objects obtained by its uses, reference is made to the accompanying drawings and descriptive matter in which preferred embodiments of the invention are illustrated.

BRIEF DESCRIPTION OF THE DRAWINGS

In the drawings:

FIG. 1 is a side view of a computer terminal or the like;

FIG. 11 is an side view of another embodiment of the invention;

FIG. 12 is a perspective blown up view of a portion of the shield of the embodiment of FIG. 11;

FIG. 13 is an side view of another embodiment of the invention;

FIG. 14 is a perspective blown up view of a portion of the shield of the embodiment of FIG. 13;

FIG. 15 is a perspective blown up view of a portion of the shield of the embodiment of FIG. 13 with a modified shape;

FIG. 18 is a perspective view of the top portion of still another embodiment of the invention;

FIG. 19 is a perspective view of the bottom portion of the embodiment of FIG. 18;

FIG. 20 is a top plan view of the fabric section used to form the top portion of the embodiment of FIG. 18;

FIG. 21 is a top plan view of the fabric section used to form the bottom portion of the embodiment of FIG. 18;

GENERAL DESCRIPTION OF THE PREFERRED EMBODIMENTS

Figure 1:
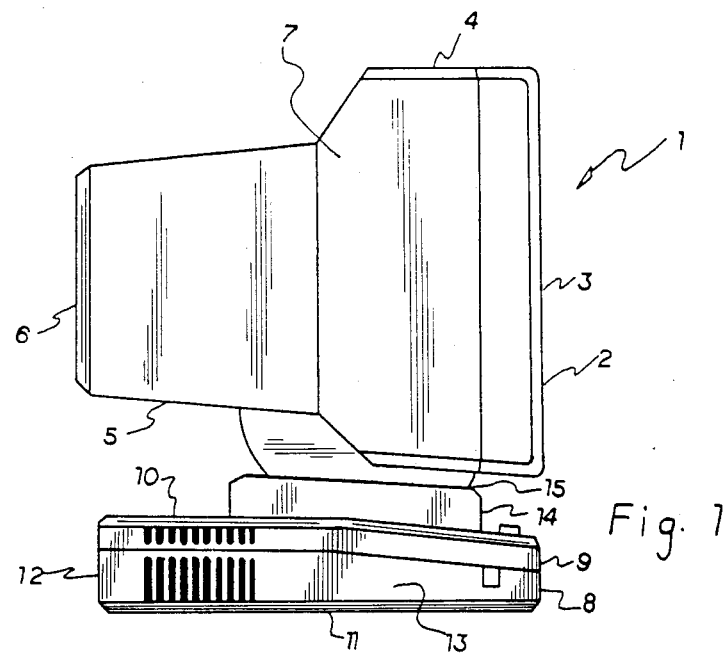

FIG. 1 shows a standard computer or computer terminal or the like generally designated 1. The computer 1 may be a terminal linked to mainframe computer or an independent mini computer or personal computer, possibly linked to other computers by a modem or the like. Whatever the specific nature of the computer 1 the invention relates to a shield for such devices. As seen in FIG. 1 such devices usually include a display unit 2 having a display screen at its front side 3, a top side 4, a bottom side 5, a rear side 6, a left side 7 and a right side(not shown). Computer 1 also may include a computer unit or digital device 8 having a front side 9, a top side 10, a bottom side 11, a rear side 12, a left side 13 and a right side(not shown). The computer may also include a stand 14 having a swivel joint 15. Computer 1 normally would include air vents such as computer unit air vent 16 and display unit air vents(not shown). Additionally, cable sockets or cables connected to the units are usually provided and disk slots for floppy disks or the like are also included in such a computer body.

Referring to the drawings in particular the invention embodied therein in FIGS. 2 to 5 comprises a rigid plastic sheet 20 having ventilation cut outs 22. The rigid sheet 20 is backed with a conductive fabric 24 bonded or the like to one side of said plastic sheet 20. The sheet is then thermoformed or the like into a box-like cylindrical shape 26.

A rigid plastic front panel 28 is provided having an opening 30 corresponding to the display unit 2 screen size. Panel 28 is backed with a conductive fabric 32 bonded or the like to one side of the front panel 28 except in the region of opening 30. This opening 30 is covered by reduced glare blackened woven or wire conductive fabric mesh 34 of blackenend metallized monofilament conductive fibers fitted in an individual section and connected to a rigid frame 36 so as to be taut. Rigid frame 36 is in turn connected to front panel 28. Frame 36 is preferably connected to front panel 28 by a bellows arrangement 38 which is loosely backed by conductive fabric. This enables a user of the computer 1 to adjust the reduced glare mesh 32 so as to center the reduced glare mesh 34 over the viewing screen of display unit 2, when the front panel 28 is covering the front of the display unit 2.

Means 40 are provided for attaching the front panel 28 to the plastic sheet 20 over the first open end or front end of the box-like structure 26 so as to maintaining continuity of electric and magnetic path in the conductive fabric bonded to the plastic sheet 20 and said front panel 28. The attachment means may either be conductive Velcro, conductive snaps or a conductive zipper or other attachment devices which maintain continuity of electric and magnetic path.

The rear opening or second opening of box-like structure 26 is covered by woven wire conductive fabric cover 42 of for covering the second open end. Means 44 for attaching conductive fabric cover 42 to the box-like structure 26 over the second end are provided for maintaining continuity of electric and magnetic path in said conductive fabric bonded to plastic sheet 26 and fabric cover 42. The attachment means 44 may either be conductive or non-conductive Velcro, conductive snaps or a conductive zipper.

The fabric cover 42 is advantageously provided with means 46 for closing around one or more cables passing through the cover 42 so as to maintain continuity of electric and magnetic path. Means 46 may be re-closeable upper and lower tabs 48 integrally formed with the conductive fabric cover 42 so as to form a gap in the fabric 42 for passage of cables associated with the computer terminal. Means 50 for connecting said upper tab and said lower tab around a cable is provided so as to secure the tabs 48 around the cable.

Figure 6:
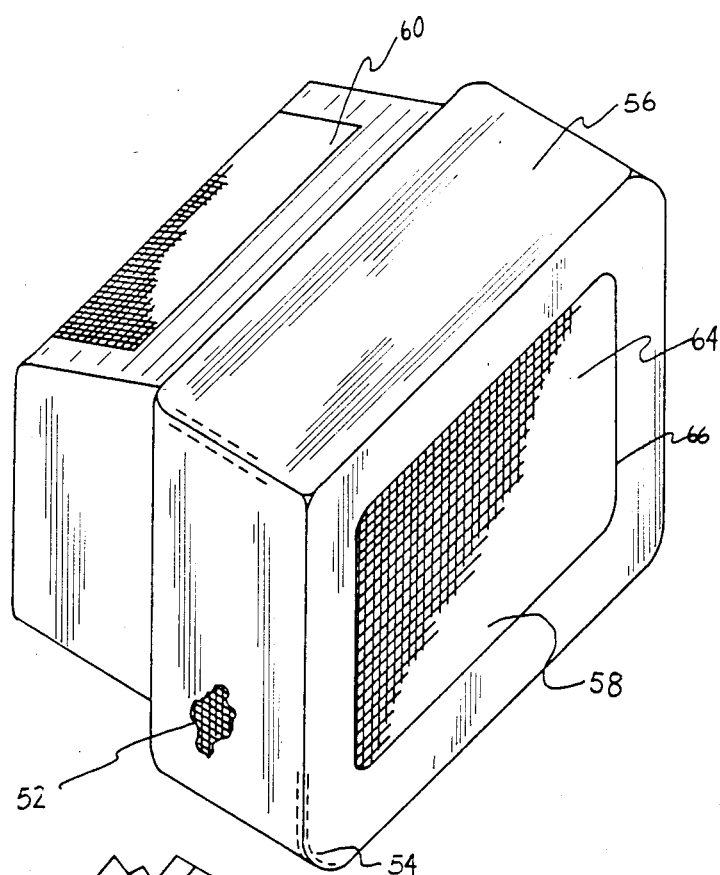
FIG. 6 is a perspective view showing another embodiment of the shield according to the invention.
Figure 7:
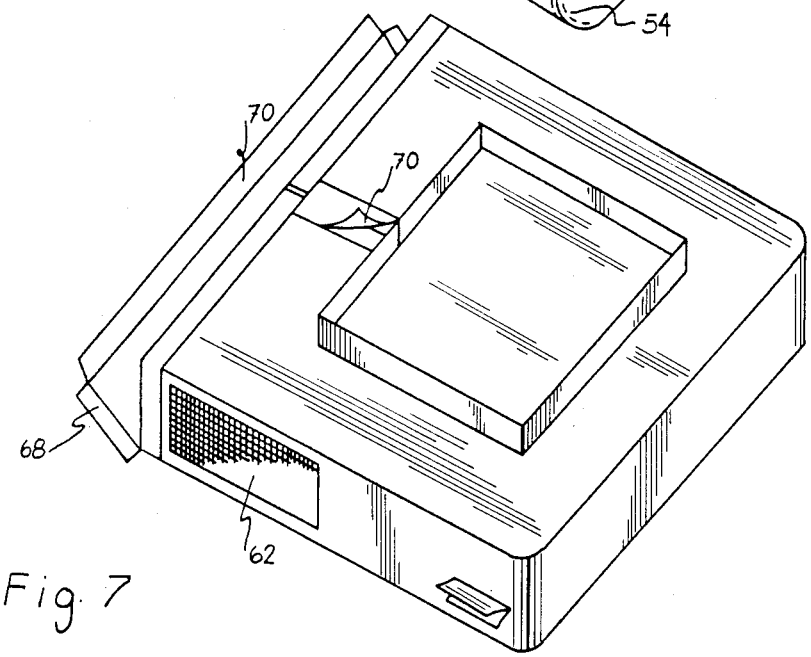
FIG. 7 is a perspective view showing the computer unit shield according to the invention.

FIGS. 6 to 7 show an alternative embodiment of the invention in which conductive fabric is cut into sheets 52 and sewn at sewn areas 54 to form a fitted shield for both the display unit 2 and computer unit 8. Wrinkle resistant cosmetic fabric fitted sheets 56 are attached over the conductive fabric 52 in all areas except for the viewing area 58 of the display screen and ventilation areas such as ventilation areas 60 and 62.

Figure 10:
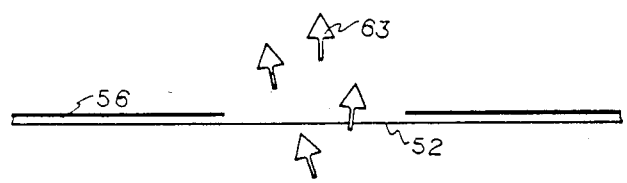
FIG. 10 is a schematic of the conductive fabric showing air flow patterns of the embodiment of FIG. 6.

The fabric 52 is air permeable so as to allow air flow as shown in FIG. 10. The cosmetic sheets 56 do not cover the fabric 52 in heat dissipation areas so as to allow heat transfer from the interior of the computer as shown by the arrows 63.

The viewing area preferably has a conductive fabric which has reduced glare attributes such as blackened mesh 64. This mesh 64 may be attached to a frame 66 which is attached to sheet 52 covering the front of the display unit 2. Frame 66 keeps the mesh 64 taut. The mesh can be protected by glass or clear plastic.

In the embodiment shown in FIGS. 6 to 10 the fabric 52 covering the computer unit 8 includes conductive fabric overlap portions 68 integrally formed with or sewn to conductive fabric section 52 covering the computer unit 8 front side. Each overlap portion extends from the area covering the computer rear side in the direction of the computer top side, right side and left side respectively. Means 70 are provided with each of the overlap sections 68 to secure each of the overlap sections 68 to the conductive fabric 52 covering the computer top side, right side and left side respectively. Means 70 may be Velcro, conductive snaps or a conductive zipper.

Figure 8:
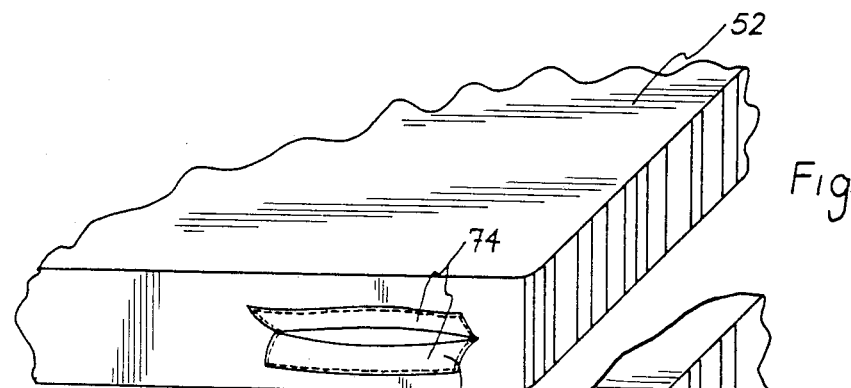
FIG. 8 is a perspective view similar to FIG. 7 showing an additional feature of the invention.
Figure 9:
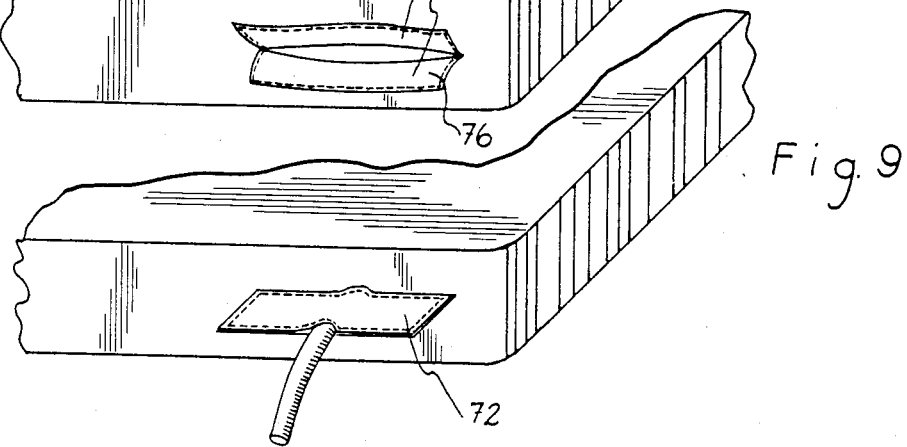
FIG. 9 is a perspective view similar to FIG. 7 showing an additional feature of the invention.

FIGS. 8 and 9 show at least one of the fitted sheets 52 advantageously provided with means 72 for closing around one or more cables passing through the sheets 52 so as to maintain continuity in the electric and magnetic path. Means 72 may be re-closeable upper and lower tabs 74 integrally formed with the conductive fabric sheets 52 so as to form a gap in the fabric 52 for passage of cables associated with the computer terminal 1. Means 76 for connecting said upper tab and said lower tab around a cable is provided so as to secure the tabs 74 around the cable.

FIGS. 11 to 16 show embodiments wherein fitted or loosely fitted fabric shields made similarly to the embodiment of FIGS. 6-10 have an opening 78 in the bottom of the shield cover 80 associated with the display unit and opening 82 in the top of the shield cover 84 associated with the computer unit. These openings correspond to the position of the stand 14 having swivel joint 15.

In the embodiment of FIGS. 11 and 12 metallized rings or bands of metallized plastic 86 and 88 are connected to the edge of the fabric openings 78 and 82 respectively. These bands are of slightly different diameter so that band 86 fits snugly about band 88. This provides an overlap of concentric circles so as to provide continuity of magnetic and electric path when the display unit 2 is positioned above the computer unit 8. This advantageously allows the display unit 2 to be swiveled without breaching the protective shielding.

In the embodiment of FIGS. 13 to 15 a conductive sleeve 90 formed of conductive material extends in a downward direction from the opening 78 to the opening 82. The sleeve is formed of a flexible bellows thereby allowing full articulation of a swivel stand connecting the display unit to the computer unit. The sleeve may either be a circular cylinder as shown in FIG. 15 or a square cylinder as shown in FIG. 14. This arrangement also ensures continuity of magnetic and electric path when the display unit 2 is swiveled relative to the computer unit 8.

Figure 17:
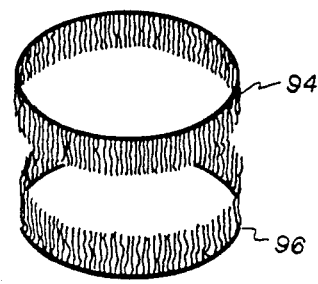
FIG. 17 is a perspective blown up view of a portion of the shield of the embodiment of FIG. 16 with a modified shape.
Figure 2:
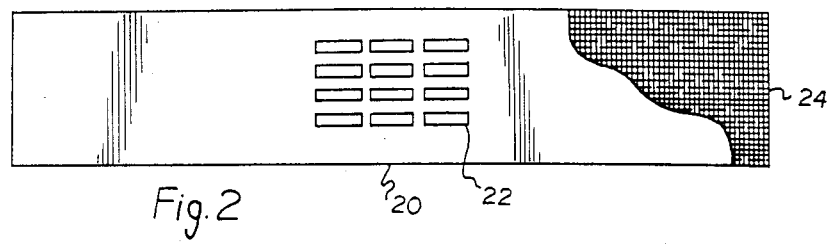
FIG. 2 is a plan view of one embodiment of the shield according to the invention showing a rigid plastic section with conductive fabric backing.
Figure 3:
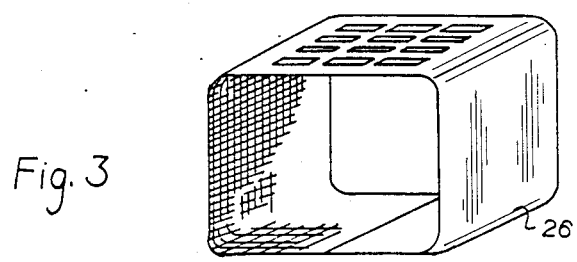
FIG. 3 is a perspective view of the rigid plastic piece of the embodiment of FIG. 2 in a box-like shaped body.
Figure 4:
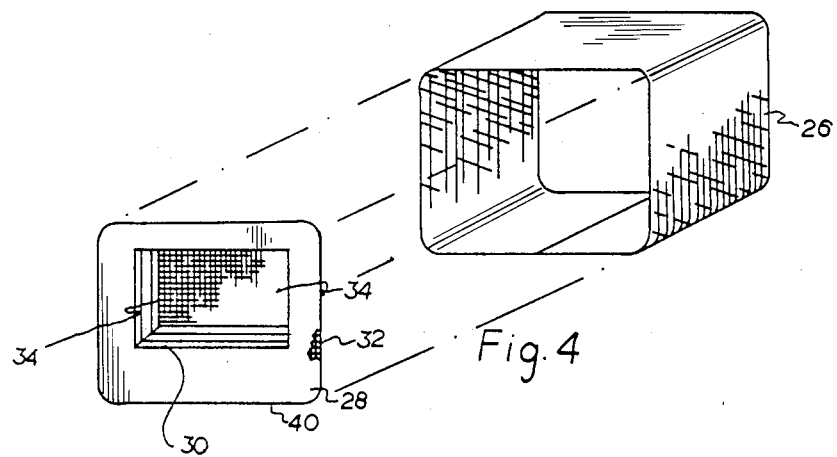
FIG. 4 is an exploded perspective view of the embodiment of FIG. 2 showing the front panel.
Figure 5:
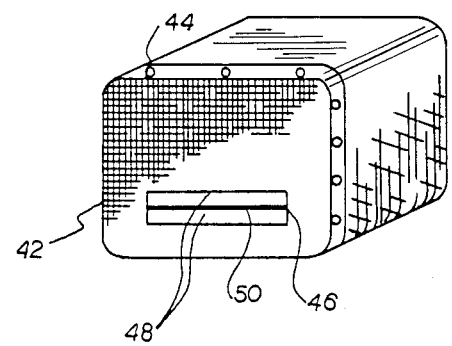
FIG. 5 is a perspective view of the embodiment of FIG. 2 showing the rear panel attached to the box-like shaped body.
Figure 16:
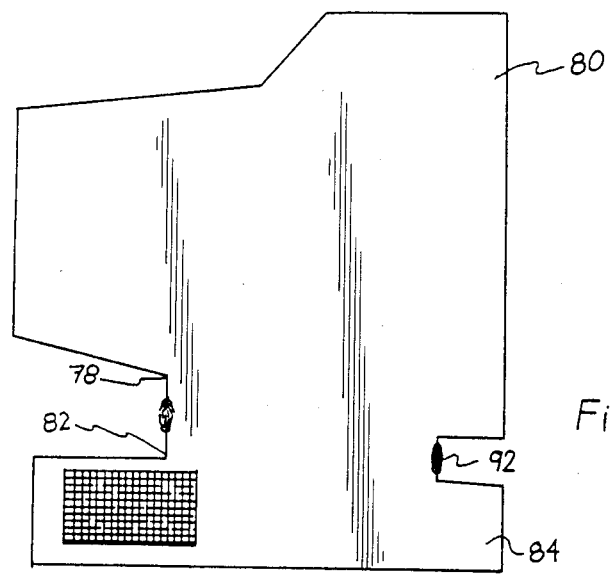
FIG. 16 is an side view of another embodiment of the invention.

In the embodiment of FIGS. 16 and 17 a conductive sleeve 92 is formed of conductive material extending in a downward direction from the opening 78 and in an upward direction from the opening 82. The sleeve is formed of upper and lower flexible conductive brushes 94 and 96 respectively. These brushes provide a supple conformable shield area allowing full articulation of a swivel stand connecting the display unit 2 to the computer unit 8. This arrangement also ensures continuity of magnetic and electric path when the display unit 2 is swiveled relative to the computer unit 8.

In the embodiments of FIGS. 18 to 22 a first cut pattern of woven wire 98 or conductive fabric 98 of metallized synthetic monofilament fibers has a central portion 100 and integral side portions 102, 104, 106, and 108 each having overlap edge portions 110. One of the side portions has a central cut out area 112 for the screen of the display unit 2. The fabric 98 is sewn to form a box-like shape, as shown in FIG. 18, by providing sewn areas 114 connecting individual fabric edge portions fabricated such that continuity of electric and magnetic path is guaranteed. A blackened woven wire or conductive fabric mesh 116 of metallized monofilament conductive fibers is fitted in an individual section and connected to the fabric section having the cut out area. A bottom to the shield is formed of a second cut pattern of conductive fabric 118 having a central portion 120 and integral side portions 122, 124, 126, and 128. Each of said side portions 122 to 128 have overlap edge portions 130. The fabric 118 is sewn to form sewn areas 132 connecting individual edge portions so as to form a box-like shape having an upper edge. The sewn areas being fabricated such that continuity of electric and magnetic path is guaranteed.

Means 134 is provided for attaching the lower edge of the first sewn fabric 98 to the edge of the second fabric 118 thereby allowing the computer terminal 1 to be positioned atop the second sewn fabric 118 and the first sewn fabric 98 covering the computer terminal 1 and the edges of the first and second sewn fabrics attached so as to maintain continuity of electric and magnetic path in the conductive fabrics and thereby insulate the computer terminal. Means 134 may be Velcro, conductive snaps or a conductive zipper. FIGS. 18 and 19 show a conductive zipper 136 and an additional conductive snap 138 provided to ensure continuity.

Figure 22:
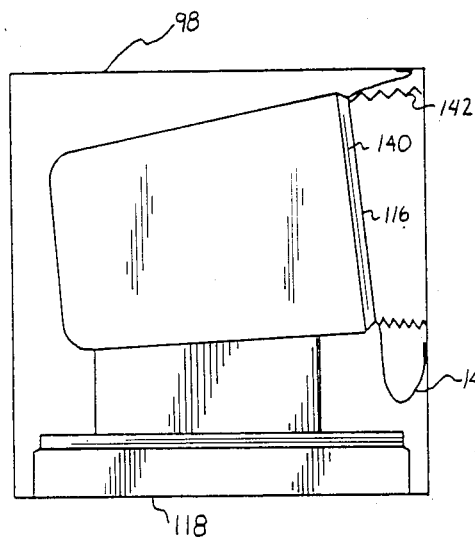
FIG. 22 is a side cut away view of the embodiment of FIG. 18.

FIG. 22 shows the interior of a shield made of sewn fabric parts 98 and 118. A frame 140 is provided to keep blackened conductive fabric 116 taut. Advantageously, the frame 140 is attached to sewn fabric part 98 by a bellows arrangement 142 having a conductive shield backing 144. This enables a user of the computer 1 to adjust the reduced glare mesh 116 so as to center the reduced glare mesh 116 over the viewing screen of display unit 2.

While specific embodiments of the invention have been shown and described in detail to illustrate the application of the principles of the invention, it will be understood that the invention may be embodied otherwise without departing from such principles.

What is claimed is:

1. An electromagnetic interference shielding cover for computers and terminals or the like, the computer including at least a display unit having a front side with a display screen, a top side, a bottom side, a right side, a left side and a rear side, heat dissipation areas for allowing heat transfer from within the display unit and at least one cable running from within the display unit through one of the sides of the display unit and a computer unit having a top side, a bottom side, a right side, a left side, a rear side, a front side, heat dissipation areas for allowing heat transfer from within the computer unit, at least one cable port associated with the computer unit and internal access areas for access within the computer unit and/or disc slot access areas, the shielding comprising:

woven wire or conductive fabric of metallized synthetic monofilament or multifilament fibers fitted in individual sections including a display unit top side conductive fabric section, bottom side conductive fabric section, right side conductive fabric section, left side conductive fabric section and rear side conductive fabric section, respectively;

sewn areas connecting each of the individual fabric sections including a display unit top side conductive fabric section, a display unit bottom side conductive fabric section, a display unit right side conductive fabric section, a display unit left side conductive fabric section and a display unit rear side conductive fabric section, said sewn areas being fabricated such that continuity of electric and magnetic path is guaranteed;

blackened woven wire conductive fabric of metallized monofilament fibers fitted in an individual section and connected to the fabric sections including a blackened woven display unit top side section, a blackened woven display unit bottom side section, a blackened woven display unit right side section, and blackened woven display unit left side section such that continuity of electric and magnetic path is guaranteed;

cosmetic layer of wrinkle resistant fabric fixed to the exterior of said conductive fabric and said blackened conductive fabric including a cosmetic layer top side, a cosmetic layer bottom side, a cosmetic layer right side, a cosmetic layer left side, a cosmetic layer rear side and a cosmetic layer front side having a display screen opening and a heat dissipation opening;

woven wire or conductive fabric of metallized synthetic monofilament fibers fitted in individual sections including a computer unit top side conductive fabric section, bottom side conductive fabric section, right side conductive fabric section, left side conductive fabric section, front side conductive fabric section and rear side conductive fabric section, respectively;

sewn areas connecting each of the individual fabric sections including computer unit top side conductive fabric section, bottom side conductive fabric section, right side conductive fabric section, left side conductive fabric section, rear side conductive fabric section and front side conductive fabric section, said sewn areas being fabricated such that continuity of electric and magnetic path is guaranteed;

conductive fabric overlap portions integrally formed with said computer unit front side conductive fabric section, each overlap portion extending from the computer unit front side conductive fabric section in the direction of the computer unit top side conductive fabric section, right side conductive fabric section and left side conductive fabric section, respectively;

means associated with each of said overlap sections to secure each of said overlap sections to the conductive fabric including the computer top side conductive fabric section, right side conductive fabric section and left side conductive fabric section, respectively;

cosmetic layer of wrinkle resistant fabric fixed to the exterior of said conductive fabric including a cosmetic layer top side section, a cosmetic layer bottom side section, a cosmetic layer right side portion, a cosmetic layer left side portion, a cosmetic layer rear side portion and a cosmetic layer front side portion and having heat dissipation openings and a display screen opening.

2. An electromagnetic interference shielding cover for computer terminals or the like according to claim 1, further comprising:

rigid frame means connected to said woven wire or conductive fabric sections covering the display unit top side, bottom side, right side and left side for maintaining said blackened conductive fabric mesh taut.

3. An electromagnetic interference shielding cover for computer terminals or the like according to claim 2, wherein: said blackened woven wire or conductive monofilament fabric section covering the display unit front side is sewn to the fabric sections covering the top side, bottom side, right side, left side such that continuity of electric and magnetic path is guaranteed.

4. An electromagnetic interference shielding cover for computer terminals or the like according to claim 2, wherein: said blackened woven wire or conductive monofilament fabric section covering the display unit front side is removable and connected to the fabric sections covering the top side, bottom side, right side, left side by conductive connector means such that continuity of electric and magnetic path is guaranteed.

5. An electromagnetic interference shielding cover for computer terminals or the like comprising:

a rigid plastic sheet having air permeable openings said plastic sheet being thermoformed into a box-like shape having a first and a second open end;

woven wire or conductive fabric of metallized synthetic monofilament fibers bonded to one side of said plastic sheet;

rigid plastic front panel having an opening corresponding to the display unit screen size;

woven wire or conductive fabric of metallized synthetic monofilament fibers bonded to one side of said rigid plastic front panel;

a rigid frame attached to said front panel;

reduced glare blackened woven wire or conductive fabric mesh of metallized monofilament fibers fitted in an individual section and connected to said rigid frame:

means for attaching said front panel to said plastic sheet over said first open end and maintaining continuity of electric and magnetic path in said conductive fabric bonded to said plastic sheet and said front panel;

woven wire or conductive fabric cover of metallized synthetic monofilament fibers for covering said second open end;

means for attaching said conductive fabric cover to said plastic sheet over said second open end and maintaining continuity of electric and magnetic path in said conductive fabric bonded to said plastic sheet and said fabric cover;

closable slot means, associated with said fabric cover for closing around one or more cables passing through said cover so as to maintain continuity in the electric and magnetic path.

6. An electromagnetic interference shielding cover for computer terminals or the like comprising:

a first cut pattern of woven wire or conductive fabric of metallized synthetic monofilament fibers having a central portion and integral side portions each of said side portions having overlap edge portions one of said side portions having a central cut out area;

sewn areas connecting individual fabric edge portions so as to form a box-like shape having a lower edge, said sewn areas being fabricated such that continuity of electric and magnetic path is guaranteed;

blackened woven wire or conductive fabric mesh of metallized monofilament fibers fitted in an individual section and connected to the fabric section having said cut out area covering the cut out area;

a second cut pattern of woven wire or conductive fabric of metallized synthetic monofilament fibers having a central portion and integral side portions each of said side portions having overlap edge portions;

sewn areas connecting individual second fabric edge portions so as to form a box-like shape having an upper edge said sewn areas being fabricated such that continuity of electric and magnetic path is guaranteed;

means for attaching the lower edge of said first sewn fabric to the upper edge of the second fabric thereby allowing the computer terminal or the like to be positioned atop said second sewn fabric said first sewn fabric covering the computer terminal or the like and the edges of the first and second sewn fabrics attached so as to maintain continuity of electric and magnetic path in the conductive fabrics and thereby insulate the computer terminal.

7. An electromagnetic interference shielding cover for computer terminals or the like according to claim 6 further comprising:

a rigid plastic sheet thermoformed into a box-like shape and bonded to a portion of the first sewn fabric.

8. An electromagnetic interference shielding cover for computers and terminals or the like, the computer including at least a display unit having a front side with a display screen, a top side, a bottom side, a right side, a left side and a rear side, heat dissipation areas for allowing heat transfer from within the display unit and at least one cable running from within the display unit through one of the sides of the display unit and a computer unit having a top side, a bottom side, a right side, a left side, a rear side, a front side, heat dissipation areas for allowing heat transfer from within the computer unit, at least one cable port associated with the computer unit and internal access areas for access within the computer unit and/or disc slot access areas, the shielding comprising:

woven wire or conductive fabric of metallized synthetic monofilament or multifilament fibers fitted in individual sections including a display unit top side conductive fabric section, bottom side conductive fabric section, right side conductive fabric section, left side conductive fabric section and rear side conductive fabric section, respectively;

sewn areas connecting each of the individual fabric sections including a display unit top side conductive fabric section, a display unit bottom side conductive fabric section, a display unit right side conductive fabric section, a display unit left side conductive fabric section and a display unit rear side conductive fabric section, said sewn areas being fabricated such that continuity of electric and magnetic path is guaranteed;

blackened woven wire conductive fabric of metallized monofilament fibers fitted in an individual section and connected to the fabric sections including a blackened woven display unit top side section, a blackened woven display unit bottom side section, a blackened woven display unit right side section, and blackened woven display unit left side section such that continuity of electric and magnetic path is guaranteed;

cosmetic layer of wrinkle resistant fabric fixed to the exterior of said conductive fabric and said blackened conductive fabric including a cosmetic layer top side, a cosmetic layer bottom side, a cosmetic layer right side, a cosmetic layer left side, a cosmetic layer rear side and a cosmetic layer front side having a display screen opening and a heat dissipation opening;

woven wire or conductive fabric of metallized synthetic monofilament fibers fitted in individual sections including a computer unit top side conductive fabric section, bottom side conductive fabric section, right side conductive fabric section, left side conductive fabric section, front side conductive fabric section and rear side conductive fabric section, respectively;

sewn areas connecting each of the individual fabric sections including computer unit top side conductive fabric section, bottom side conductive fabric section, right side conductive fabric section, left side conductive fabric section, rear side conductive fabric section and front side conductive fabric section, said sewn areas being fabricated such that continuity of electric and magnetic path is guaranteed;

conductive fabric overlap portions integrally formed with said computer unit front side conductive fabric section, each overlap portion extending from the computer unit front side conductive fabric section in the direction of the computer unit top side conductive fabric section, right side conductive fabric section and left side conductive fabric section, respectively;

means associated with each of said overlap sections to secure each of said overlap sections to the conductive fabric including the computer top side conductive fabric section, right side conductive fabric section and left side conductive fabric section, respectively;

cosmetic layer of wrinkle resistant fabric fixed to the exterior of said conductive fabric including a cosmetic layer top side section, a cosmetic layer bottom side section, a cosmetic layer right side portion, a cosmetic layer left side portion, a cosmetic layer rear side portion and a cosmetic layer front side portion and having heat dissipation openings and a display screen opening;

re-closeable upper and lower cable port tabs integrally formed with said woven wire or conductive fabric covering the computer unit so as to form a gap in said woven wire conductive fabric; and, means for connecting said upper tab and said lower tab around a cable so as to secure said tabs around the cable.

9. An electromagnetic interference shielding cover for computers and terminals or the like, the computer including at least a display unit having a front side with a display screen, a top side, a bottom side, a right side, a left side and a rear side, heat dissipation areas for allowing heat transfer from within the display unit and at least one cable running from within the display unit through one of the sides of the display unit and a computer unit having a top side, a bottom side, a right side, a left side, a rear side, a front side, heat dissipation areas for allowing heat transfer from within the computer unit, at least one cable port associated with the computer unit and internal access areas for access within the computer unit and/or disc slot access areas, the shielding comprising:

woven wire or conductive fabric of metallized synthetic monofilament or multifilament fibers fitted in individual sections including a display unit top side conductive fabric section, bottom side conductive fabric section, right side conductive fabric section, left side conductive fabric section and rear side conductive fabric section, respectively;

sewn areas connecting each of the individual fabric sections including a display unit top side conductive fabric section, a display unit bottom side conductive fabric section, a display unit right side conductive fabric section, a display unit left side conductive fabric section and a display unit rear side conductive fabric section, said sewn areas being fabricated such that continuity of electric and magnetic path is guaranteed;

blackened woven wire conductive fabric of metallized monofilament fibers fitted in an individual section and connected to the fabric sections including a blackened woven display unit top side section, a blackened woven display unit bottom side section, a blackened woven display unit right side section, and blackened woven display unit left side section such that continuity of electric and magnetic path is guaranteed;

cosmetic layer of wrinkle resistant fabric fixed to the exterior of said conductive fabric and said blackened conductive fabric including a cosmetic layer top side, a cosmetic layer bottom side, a cosmetic layer right side, a cosmetic layer left side, a cosmetic layer rear side and a cosmetic layer front side having a display screen opening and a heat dissipation opening;

woven wire or conductive fabric of metallized synthetic monofilament fibers fitted in individual sections including a computer unit top side conductive fabric section, bottom side conductive fabric section, right side conductive fabric section, left side conductive fabric section, front side conductive fabric section and rear side conductive fabric section, respectively;

sewn areas connecting each of the individual fabric sections including computer unit top side conductive fabric section, bottom side conductive fabric section, right side conductive fabric section, left side conductive fabric section, rear side conductive fabric section and front side conductive fabric section, said sewn areas being fabricated such that continuity of electric and magnetic path is guaranteed;

conductive fabric overlap portions integrally formed with said computer unit front side conductive fabric section, each overlap portion extending from the computer unit front side conductive fabric section in the direction of the computer unit top side conductive fabric section, right side conductive fabric section and left side conductive fabric section, respectively;

means associated with each of said overlap sections to secure each of said overlap sections to the conductive fabric including the computer top side conductive fabric section, right side conductive fabric section and left side conductive fabric section, respectively;

cosmetic layer of wrinkle resistant fabric fixed to the exterior of said conductive fabric including a cosmetic layer top side section, a cosmetic layer bottom side section, a cosmetic layer right side portion, a cosmetic layer left side portion, a cosmetic layer rear side portion and a cosmetic layer front side portion and having heat dissipation openings and a display screen opening;

re-closeable upper and lower cable port tabs integrally formed with said woven wire or conductive fabric covering of the display unit so as to form a gap in said woven wire or conductive fabric; and, means for connecting said upper tab and said lower tab around a cable so as to secure said tabs around the cable.

10. An electromagnetic interference shielding cover for computers and terminals or the like, the computer including at least a display unit having a front side with a display screen, a top side, a bottom side, a right side, a left side and a rear side, heat dissipation areas for allowing heat transfer from within the display unit and at least one cable running from within the display unit through one of the sides of the display unit and a computer unit having a top side, a bottom side, a right side, a left side, a rear side, a front side, heat dissipation areas for allowing heat transfer from within the computer unit, at least one cable port associated with the computer unit and internal access areas for access within the computer unit and/or disc slot access areas, the shielding comprising:

- woven wire or conductive fabric of metallized synthetic monofilament or multifilament fibers fitted in individual sections including a display unit top side conductive fabric section, bottom side conductive fabric section, right side conductive fabric section, left side conductive fabric section and rear side conductive fabric section, respectively;
- sewn areas connecting each of the individual fabric sections including a display unit top side conductive fabric section, a display unit bottom side conductive fabric section, a display unit right side conductive fabric section, a display unit left side conductive fabric section and a display unit rear side conductive fabric section, said sewn areas being fabricated such that continuity of electric and magnetic path is guaranteed;
- blackened woven wire conductive fabric of metallized monofilament fibers fitted in an individual section and connected to the fabric sections including a blackened woven display unit top side section, a blackened woven display unit bottom side section, a blackened woven display unit right side section, and blackened woven display unit left side section such that continuity of electric and magnetic path is guaranteed;
- cosmetic layer of wrinkle resistant fabric fixed to the exterior of said conductive fabric and said blackened conductive fabric including a cosmetic layer top side, a cosmetic layer bottom side, a cosmetic layer right side, a cosmetic layer left side, a cosmetic layer rear side and a cosmetic layer front side having a display screen opening and a heat dissipation opening;
- woven wire or conductive fabric of metallized synthetic monofilament fibers fitted in individual sections including a computer unit top side conductive fabric section, bottom side conductive fabric section, right side conductive fabric section, left side conductive fabric section, front side conductive fabric section and rear side conductive fabric section, respectively;
- sewn areas connecting each of the individual fabric sections including computer unit top side conductive fabric section, bottom side conductive fabric section, right side conductive fabric section, left side conductive fabric section, rear side conductive fabric section and front side conductive fabric section, said sewn areas being fabricated such that continuity of electric and magnetic path is guaranteed;
- conductive fabric overlap portions integrally formed with said computer unit front side fabric section, each overlap portion extending from the computer unit front side conductive fabric section in the direction of the computer unit top side conductive fabric section, right side conductive fabric section and left side conductive fabric section, respectively;
- means associated with each of said overlap sections to secure each of said overlap sections to the conductive fabric including the computer top side conductive fabric section, right side conductive fabric section and left side conductive fabric section, respectively;
- cosmetic layer of wrinkle resistant fabric fixed to the exterior of said conductive fabric including a cosmetic layer top side section, a cosmetic layer bottom side section, a cosmetic layer right side portion, a cosmetic layer left side portion, a cosmetic layer rear side portion and a cosmetic layer front side portion and having heat dissipation openings and a display screen opening;
- said display unit conductive fabric bottom section side forms a generally circular opening, the edge of said opening of said fabric covering the display unit bottom side being attached to a metallized mesh circular band formed of metallized plastic or other conductive material, said band having a diameter coinciding with said generally circular opening and extending in a downward direction from said opening; and, said computer unit fabric top section forms a generally circular opening, the edge of said opening in said computer unit fabric top section being attached to a metallized mesh circular band formed of metallized plastic or other conductive material, said band having a diameter coinciding with said generally circular opening in said computer unit top side fabric section but slightly different from the diameter of the generally circular opening in said display unit bottom side fabric section and extending in an upward direction from said opening in said computer unit top side fabric section so as to form with said circular band of said display unit bottom side fabric section concentric circular bands interfitting when the display unit is positioned above the computer unit.

11. An electromagnetic interference shielding cover for computers and terminals or the like, the computer including at least a display unit having a front side with a display screen, a top side, a bottom side, a right side, a left side and a rear side, heat dissipation areas for allowing heat transfer from within the display unit and at least one cable running from within the display unit through one of the sides of the display unit and a computer unit having a top side, a bottom side, a right side, a left side, a rear side, a front side, heat dissipation areas for allowing heat transfer from within the computer unit, at least one cable port associated with the computer unit and internal access areas for access within the computer unit and/or disc slot access areas, the shielding comprising:

- woven wire or conductive fabric of metallized synthetic monofilament or multifilament fibers fitted in individual sections including a display unit top side conductive fabric section, bottom side conductive fabric section, right side conductive fabric section, left side conductive fabric section and rear side conductive fabric section, respectively;
- sewn areas connecting each of the individual fabric sections including a display unit top side conductive fabric section, a display unit bottom side conductive fabric section, a display unit right side conductive fabric section, a display unit left side conductive fabric section and a display unit rear side conductive fabric section, said sewn areas being fabricated such that continuity of electric and magnetic path is guaranteed;
- blackened woven wire conductive fabric of metallized monofilament fibers fitted in an individual section and connected to the fabric sections including a blackened woven display unit top side section, a blackened woven display unit bottom side section, a blackened woven display unit right side section, and blackened woven display unit left side section such that continuity of electric and magnetic path is guaranteed;

cosmetic layer of wrinkle resistant fabric fixed to the exterior of said conductive fabric and said blackened conductive fabric including a cosmetic layer top side, a cosmetic layer bottom side, a cosmetic layer right side, a cosmetic layer left side, a cosmetic layer rear side and a cosmetic layer front side having a display screen opening and a heat dissipation opening;

woven wire or conductive fabric of metallized synthetic monofilament fibers fitted in individual sections including a computer unit top side conductive fabric section, bottom side conductive fabric section, right side conductive fabric section, left side conductive fabric section, front side conductive fabric section and rear side conductive fabric section, respectively;

sewn areas connecting each of the individual fabric sections including computer unit top side conductive fabric section, bottom side conductive fabric section, right side conductive fabric section, left side conductive fabric section, rear side conductive fabric section and front side conductive fabric section, said sewn areas being fabricated such that continuity of electric and magnetic path is guaranteed;

conductive fabric overlap portions integrally formed with said computer unit front side fabric section, each overlap portion extending from the computer unit front side conductive fabric section in the direction of the computer unit top side conductive fabric section, right side conductive fabric section and left side conductive fabric section, respectively;

means associated with each of said overlap sections to secure each of said overlap sections to the conductive fabric including the computer top side conductive fabric section, right side conductive fabric section and left side conductive fabric section, respectively;

cosmetic layer of wrinkle resistant fabric fixed to the exterior of said conductive fabric including a cosmetic layer top side section, a cosmetic layer bottom side section, a cosmetic layer right side portion, a cosmetic layer left side portion, a cosmetic layer rear side portion and a cosmetic layer front side portion and having heat dissipation openings and a display screen opening;

said conductive fabric section covering the display unit bottom side forms an opening, the edge of said opening of said display unit bottom side conductive fabric section being attached to a conductive sleeve formed of conductive material, said sleeve extending in a downward direction from said opening and connected to an opening in said computer unit conductive fabric top side section, said sleeve in the form of a flexible bellows thereby allowing full articulation of a swivel stand connecting the display unit conductive fabric bottom section to the computer unit conductive fabric top section.

12. An electromagnetic interference shielding cover for computers and terminals or the like, the computer including at least a display unit having a front side with a display screen, a top side, a bottom side, a right side, a left side and a rear side, heat dissipation areas for allowing heat transfer from within the display unit and at least one cable running from within the display unit through one of the sides of the display unit and a computer unit having a top side, a bottom side, a right side, a left side, a rear side, a front side, heat dissipation areas for allowing heat transfer from within the computer unit, at least one cable port associated with the computer unit and internal access areas for access within the computer unit and/or disc slot access areas, the shielding comprising:

woven wire or conductive fabric of metallized synthetic monofilament or multifilament fibers fitted in individual sections including a display unit top side conductive fabric section, bottom side conductive fabric section, right side conductive fabric section, left side conductive fabric section and rear side conductive fabric section, respectively;

sewn areas connecting each of the individual fabric sections including a display unit top side conductive fabric section, a display unit bottom side conductive fabric section, a display unit right side conductive fabric section, a display unit left side conductive fabric section and a display unit rear side conductive fabric section, said sewn areas being fabricated such that continuity of electric and magnetic path is guaranteed;

blackened woven wire conductive fabric of metallized monofilament fibers fitted in an individual section and connected to the fabric sections including a blackened woven display unit top side section, a blackened woven display unit bottom side section, a blackened woven display unit right side section, and blackened woven display unit left side section such that continuity of electric and magnetic path is guaranteed;

cosmetic layer of wrinkle resistant fabric fixed to the exterior of said conductive fabric and said blackened conductive fabric including a cosmetic layer top side, a cosmetic layer bottom side, a cosmetic layer right side, a cosmetic layer left side, a cosmetic layer rear side and a cosmetic layer front side having a display screen opening and a heat dissipation opening;

woven wire or conductive fabric of metallized synthetic monofilament fibers fitted in individual sections including a computer unit top side conductive fabric section, bottom side conductive fabric section, right side conductive fabric section, left side conductive fabric section, front side conductive fabric section and rear side conductive fabric section, respectively;

sewn areas connecting each of the individual fabric sections including computer unit top side conductive fabric section, bottom side conductive fabric section, right side conductive fabric section, left side conductive fabric section, rear side conductive fabric section and front side conductive fabric section, said sewn areas being fabricated such that continuity of electric and magnetic path is guaranteed;

conductive fabric overlap portions integrally formed with said computer unit front side fabric section, each overlap portion extending from the computer unit front side conductive fabric section in the direction of the computer unit top side conductive fabric section, right side conductive fabric section and left side conductive fabric section, respectively;

means associated with each of said overlap sections to secure each of said overlap sections to the conductive fabric including the computer top side conductive fabric section, right side conductive fabric section and left side conductive fabric section, respectively;

cosmetic layer of wrinkle resistant fabric fixed to the exterior of said conductive fabric including a cosmetic layer top side section, a cosmetic layer bottom side section, a cosmetic layer right side portion, a cosmetic layer left side portion, a cosmetic layer rear side portion and a cosmetic layer front side portion and having heat dissipation openings and a display screen opening;

said conductive fabric section covering the display unit bottom side forms an opening, the edge of said opening of said display unit conductive fabric bottom section being attached to a conductive sleeve formed of flexible conductive filaments, said sleeve extending in a downward direction from said opening and said computer unit conductive fabric top section forms an opening, the edge of said opening of said display unit fabric top section being attached to a conductive sleeve formed of flexible conductive filaments said sleeve extending in an upward direction from said opening of said computer unit fabric top section said flexible filaments associated with the display unit fabric sections and the flexible filaments associated with the computer unit fabric sections overlapping and intermingling thereby allowing full articulation of a swivel stand connecting the display unit fabric sections to the computer unit fabric sections while maintaining continuity of electric and magnetic path.

13. An electromagnetic interference shielding cover for computer terminals or the like comprising:

a rigid plastic sheet having air permeable openings said plastic sheet being thermoformed into a box-like shape having a first and a second open end;

woven wire or conductive fabric of metallized synthetic monofilament fibers bonded to one side of said plastic sheet;

rigid plastic front panel having an opening corresponding to the display unit screen size;

woven wire or conductive fabric of metallized synthetic monofilament fibers bonded to one side of said rigid plastic front panel;

a rigid frame attached to said front panel;

reduced glare blackened woven wire or conductive fabric mesh of metallized monofilament fibers fitted in an individual section and connected to said rigid frame:

means for attaching said front panel to said plastic sheet over said first open end and maintaining continuity of electric and magnetic path in said conductive fabric bonded to said plastic sheet and said front panel.

woven wire or conductive fabric cover of metallized synthetic monofilament fibers for covering said second open end;

means for attaching said conductive fabric cover to said plastic sheet over said second open end and maintaining continuity of electric and magnetic path in said conductive fabric bonded to said plastic sheet and said fabric cover;

closable slot means, associated with said fabric cover for closing around one or more cables passing through said cover so as to maintain continuity in the electric and magnetic path;

re-closeable upper and lower tabs integrally formed with said fabric for covering said second open end so as to form a gap in said fabric for covering said second opening for passage of cables associated with the computer terminal; and, means for connecting said upper tab and said lower tab around a cable so as to secure said tabs around the cable.

14. An electromagnetic interference shielding cover for computer terminals or the like comprising:

a first cut pattern of woven wire or conductive fabric of metallized synthetic monofilament fibers having a central portion and integral side portions each of said side portions having overlap edge portions one of said side portions having a central cut out area;

sewn areas connecting individual fabric edge portions so as to form a box-like shape having a lower edge, said sewn areas being fabricated such that continuity of electric and magnetic path is guaranteed;

blackened woven wire or conductive fabric mesh of metallized monofilament fibers fitted in an individual section and connected to the fabric section having said cut out area covering the cut out area;

a second cut pattern of woven wire or conductive fabric of metallized synthetic monofilament fibers having a central portion and integral side portions each of said side portions having overlap edge portions;

sewn areas connecting individual second fabric edge portions so as to form a box-like shape having an upper edge said sewn areas being fabricated such that continuity of electric and magnetic path is guaranteed;

means for attaching the lower edge of said first sewn fabric to the upper edge of the second fabric thereby allowing the computer terminal or the like to be positioned atop said second sewn fabric said first sewn fabric covering the computer terminal or the like and the edges of the first and second sewn fabrics attached so as to maintain continuity of electric and magnetic path in the conductive fabrics and thereby insulate the computer terminal;

re-closeable upper and lower tabs integrally formed with said first sewn conductive fabric covering the computer terminal so as to form a gap in said first sewn conductive fabric unit for passage of cables associated with the computer terminal; and, means for connecting said upper tab and said lower tab around a cable so as to secure said tabs around the cable.

15. An electromagnetic interference shielding cover for computer terminals or the like comprising:

a first cut pattern of woven wire or conductive fabric of metallized synthetic monofilament fibers having a central portion and integral side portions each of said side portions having overlap edge portions one of said side portions having a central cut out area;

sewn areas connecting individual fabric edge portions so as to form a box-like shape having a lower edge, said sewn areas being fabricated such that continuity of electric and magnetic path is guaranteed;

blackened woven wire or conductive fabric mesh of metallized monofilament fibers fitted in an individual section and connected to the fabric section having said cut out area covering the cut out area;

a second cut pattern of woven wire or conductive fabric of metallized synthetic monofilament fibers having a central portion and integral side portions each of said side portions having overlap edge portions;

sewn areas connecting individual second fabric edge portions so as to form a box-like shape having an upper edge said sewn areas being fabricated such that continuity of electric and magnetic path is guaranteed;

means for attaching the lower edge of said first sewn fabric to the upper edge of the second fabric thereby allowing the computer terminal or the like to be positioned atop said second sewn fabric said first sewn fabric covering the computer terminal or the like and the edges of the first and second sewn fabrics attached so as to maintain continuity of electric and magnetic path in the conductive fabrics and thereby insulate the computer terminal, said blackened conductive mesh fabric is held taut by a frame and said frame and said blackened conductive mesh fabric are connected to said fabric section having a cut out area by means of a bellows, having a conductive fabric backing.

* * * * *